United States Patent [19]

Schenck

[11] 3,761,916

[45] Sept. 25, 1973

[54] ANALOG TO DIGITAL CONVERTER

[76] Inventor: James Schenck, 119 Commonwealth Ave., Boston, Mass. 02116

[22] Filed: Feb. 28, 1972

[21] Appl. No.: 229,887

[52] U.S. Cl. .................... 340/347 AD, 340/347 SY

[51] Int. Cl. .................... H03k 13/02

[58] Field of Search ............... 340/347 AD, 347 CC, 340/347 SY; 235/154, 155; 332/10, 22; 325/153, 60; 329/112

[56] References Cited

UNITED STATES PATENTS 3,460,122 8/1969 Barber .................... 340/347 AD

*Primary Examiner*—Maynard R. Wilbur
*Assistant Examiner*—Jeremiah Glassman
*Attorney*—Robert A. Cesari et al.

[57] ABSTRACT

An analog to digital converter that is capable of megabit conversion rates operates in the phase domain. The analog voltage to be digitized is first transformed into a corresponding phase angle by angle modulating a high frequency carrier and the conversion is performed on this angle. The output of each stage of the converter is monitored and applied to the next higher order stage to control transitions in that stage. By this means, the conversion accuracy is made independent of the number of bits in the converted signal and is limited only by the accuracy of the stage generating the lowest order bit. Both binary and Gray code representations can be obtained simultaneously.

20 Claims, 4 Drawing Figures

ANALOG TO DIGITAL CONVERTER

FIELD OF THE INVENTION

The invention relates to analog to digital converters and comprises an analog to digital converter operating in the phase domain and having enhanced speed and accuracy.

PRIOR ART

A wide variety of converters have heretofore been utilized to convert an analog signal (generally a voltage) into its corresponding digital representation. Typically, such converters operate in the voltage or current domain, that is, the signal to be converted is represented as a voltage or current throughout the conversion process.

One common form of high speed analog to digital converter is known as a cascade converter. In this type of converter, the magnitude of the analog voltage is repeatedly doubled (in the case of a binary converter) and compared with a reference voltage, the state of each bit in the converter being set to 0 or 1 dependent on whether the doubled voltage is greater than, or less than, the reference level. This type of converter has heretofore achieved only moderate conversion rates. Further, its accuracy is limited by the accuracy of the first stage and, as the number of bits increases, the first stage accuracy required to achieve a given overall accuracy becomes unduly stringent. Additionally, a large number of highly stable reference sources are required for the comparisons.

Another common type of converter compares the voltage to be converted with a voltage signal whose magnitude increases linearly with time (a so-called "ramp" signal). The time elapsed between the starting time of the ramp signal and the time that its magnitude first exceeds the magnitude of the analog voltage to be measured is accurately determined and, together with the known slope of the ramp voltage, provides a direct indication of the magnitude of the analog voltage. This time difference may be used to control a counter which starts from zero and counts at a known rate for the given time duration to provide a digital output proportional to the time duration and thus to the magnitude of the analog signal. The conversion rate of such a converter is a function of the magnitude of the signal converted, and thus can vary from a relatively short time, when a signal of small magnitude is to be digitized, to a very long time when a signal of large magnitude is to be digitized.

Angle to decimal converters have been utilized for digitizing the shaft angle of resolver transducers (e.g., see U.S. Pat. No. 3,068,456 (issued Dec. 11, 1962 to Searle G. Nevius) but their applicability to voltage to digital converters of the type described herein has not previously been suggested.

Frequently it is desirable to generate not only the binary code for an analog signal, but also the Gray code as well. Often this is done by first generating one of these codes from the analog signal and then further converting this one code into the other code. The additional conversion increases the complexity and thus the cost of the system. It may also increase the conversion time.

SUMMARY OF THE INVENTION

Objects of the Invention

Accordingly, it is an object of the invention to provide an improved analog to digital converter.

Further, it is an object of the invention to provide an analog to digital converter capable of high speed and high accuracy.

Another object of the invention is to provide an analog to digital converter whose conversion accuracy depends only on the accuracy of the stage generating the lowest order bit.

Yet another object of the invention is to provide an analog to digital converter which can provide both binary and Gray code representations simultaneously.

BRIEF DESCRIPTION OF THE INVENTION

In accordance with the invention, I initiate the digitization of an analog signal by first converting the signal to an equivalent phase angle. All subsequent operations involved in the digitization are then performed on this phase angle. For purpose of illustration, the conversion will be described in terms of an analog to binary conversion.

The voltage to phase conversion is accomplished by angle modulating a high-frequency carrier by an amount directly proportional to the analog signal which is to be digitized. Thus, I transform a carrier, e.g., sin $\omega t$, into an angle-modulated signal sin $(\omega t + \delta)$, where the angle $\delta$ satisfies the condition $0 \leq \delta \leq 2\pi$. The equivalent angular value assigned to each bit in the conversion is determined by the requirement that the range $R$ of the conversion, which is here defined as $R=2^N$, with $N$ the number of bits in the conversion, corresponds to an angle of $2\pi$. The least significant bit corresponds to an angular increment of $2\pi/R$ radians, and the magnitude $|V|$ of the analog voltage $V(t)$ which is to be digitized is thus represented by an angle $\delta = |V| \, 2\pi/R$.

Conversion decisions are then made on the angle $\delta$ as follows: The highest order, or most significant bit, $B_o$, of the binary representation will be a logical 1 if $\delta$ is in the upper half of its range, i.e., $\pi \leq \delta < 2\pi$, and is 0 otherwise. The next most significant bit, $B_1$, is a logical 1 if $\pi/2 \leq \delta < \pi$ or if $3\pi/2 \leq \delta < 2\pi$, i.e. if $\pi \leq 2\delta < 2\pi$, and is zero otherwise. The second next most significant bit, $B_2$, is then determined as a logical 1 if $\pi \leq 4\delta < 2\pi$ and is 0 otherwise. Succeeding bits are obtained in the same manner. In general, defining $\delta_n = 2^n \delta_R$, the $B_n$ are given by $$B_n = \begin{cases} 0, & 0 \leq \delta_n < \pi \\ 1, & \pi \leq \delta_n < 2\pi. \end{cases}$$

Thus, the conversion problem has been transformed to one involving the generation of the successive $\delta_n$ and examining their magnitudes.

To obtain these, the angle-modulated signal sin $(\omega t + \delta)$ is repeatedly squared, downconverted, and examined. Squaring forms the product $\sin^2(\omega t + \delta) = \frac{1}{2}[1 - \cos(2\omega t + 2\delta]$ and this is passed through a high-pass filter to remove the DC term, downconverted by multiplying it by sin $3\omega t$ to obtain $\frac{1}{2}[\sin(5\omega t + 2\delta) + /\sin(\omega t - 2\delta)]$, and filtered by a low-pass filter to remove the high-frequency term. The signal is then amplified to make up for losses in the conversion process, and inverted when $n$ is odd. The resultant, sin $(\omega t - 2\delta)$, is a signal whose frequency is the same as the original signal but whose relative phase, $-2\delta$, is twice that of the original angle-modulated signal. The magnitude of the relative phase of this signal is examined as described below to determine the corresponding bit. Additionally, the signal also is applied to the succeeding stage in which it is doubled and again downconverted to form $\sin(\omega t + 4\delta)$, and so forth. In general, the doubled and downconverted output of each stage will be of the form $\sin[\omega t + (-2)^n\delta] = \sin[\omega t + (-1)^n\delta_n]$; this will be referred to hereinafter as phase expanded version of the angle modulated signal.

It is these phase expanded signals which are utilized to determine the bits of each stage. By multiplying them by $\cos \omega t$ and performing the appropriate filtering and amplification as indicated above, one obtains, for the $n$th stage, a DC signal $\sin \delta_n$ from which the state of $B_n$ may be determined by noting that $B_n$ is a logical 0 when $0 \leq \delta_n < \pi$, that is, when $\sin \delta_n$ is positive, and is a logical 1 when $\pi \leq \delta_n < 2\pi$, that is, when $\sin \delta_n$ is negative. Thus, by examining the magnitude of the resultant DC signal, $\sin \delta_n$, one can decide whether $B_n$ is a logical 0 or a logical 1.

The Gray code can also be obtained simultaneously and with little additional circuitry by multiplying the phase-expanded signal $\sin[\omega t + (-1)^n\delta_n]$ by $\sin \omega t$, filtering, and amplifying to obtain a DC signal, $\cos \delta_n$. Analogous to the deicision process in obtaining the $B_n$, the Gray bits are obtained from $\cos \delta_n$ as $$G_{n+1} = \begin{cases} 0, & \text{for } \cos \delta_n \geq 0 \\ 1, & \text{for } \cos \delta_n < 0. \end{cases}$$

The functions $\sin \delta_n$ and $\cos \delta_n$ are referred to hereinafter as "preliminary decision functions."

Errors in the conversion process arise from uncertainties when the preliminary decision function is at the transition level. The transition level is that level at which a decision function changes from one state to another to indicate a change in a corresponding bit. Here the transition level is zero. When the signal is at the transition level, any errors in the signal due to noise, etc. may shift the level of the signal to one side or the other of the transition and therefore cause an incorrect decision. The effect is most serious in the higher order stages, since these contribute most to the numeric "value" of the digital representation. To avoid this problem, I incorporate error-correcting circuitry into my converter so that the error of the conversion can at no time be greater than one least significant bit. Thus, the decision making circuits of the highest order stage need be no more precise than those of the lowest order stage.

I accomplish the error correction by feeding back to any given stage the output of the next lowest order stage and then combining that output with the phase expanded outputs of the given stage to form a decision function for that stage. This not only eliminates ambiguities in signals at the transition level but also ensures that transitions in adjacent states are synchronized as required by the natural binary code.

DETAILED DESCRIPTION OF THE INVENTION

The foregoing and other and further objects and features of the invention are more readily understood from the following detailed description of the invention when taken in conjunction with the drawings in which.

Figure 1:
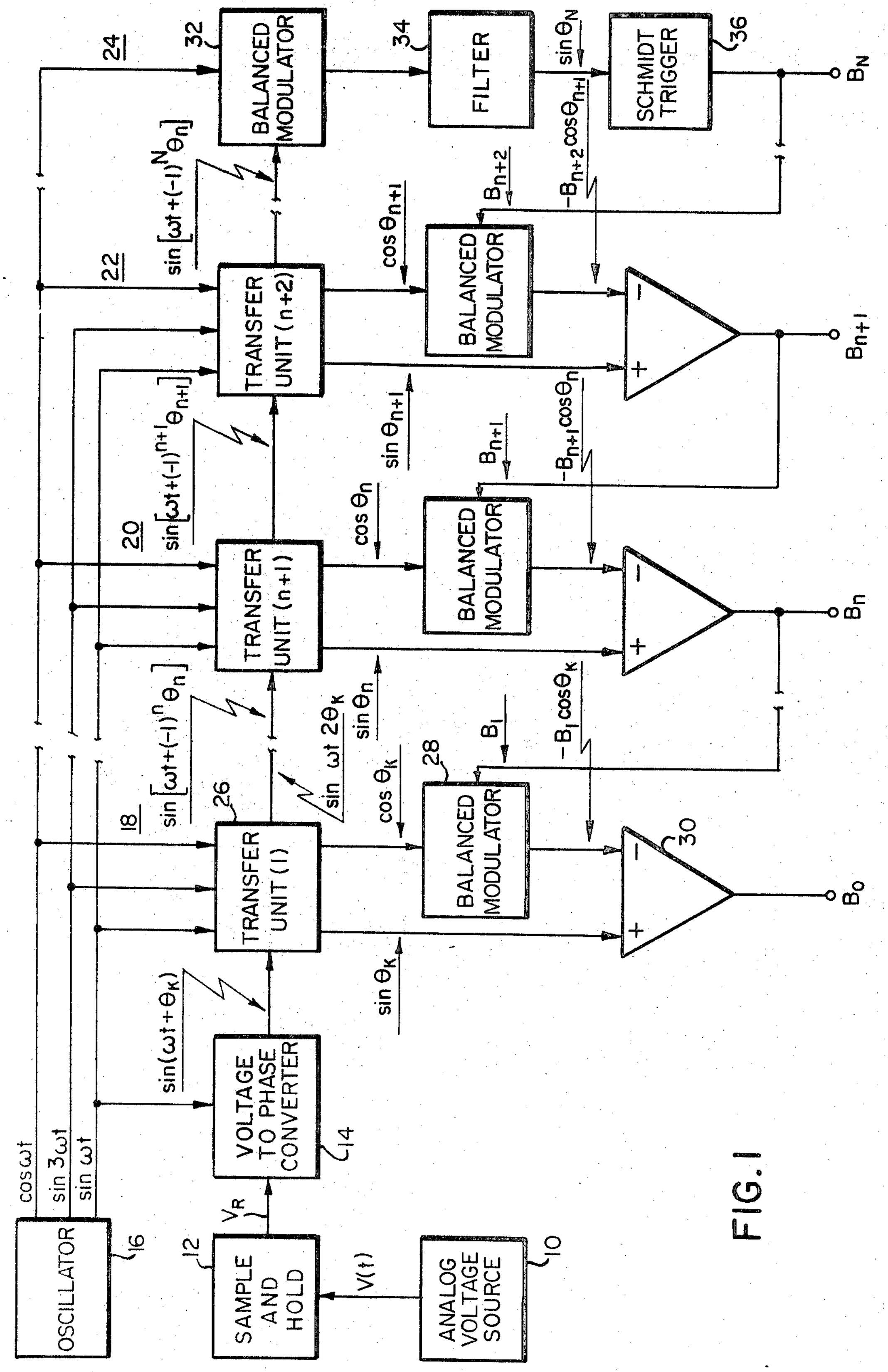
FIG. 1 is a block and line diagram of a preferred embodiment of analog-to-digital converter in accordance with the invention.

In FIG. 1, an analog source 10 provides a signal whose magnitude is to be digitized. The source 10 is external to the converter and forms no part of it. The source will most commonly be a voltage source and it will be described as such herein. For purposes of illustration, it will be assumed that the voltage output $V(t)$ of the source has a positive magnitude. When this is not the case, an additional comparison may be utilized to determine the sign of the voltage and an additional bit will be required to represent the sign as being either positive or negative. This is well known to those skilled in the art and need not be described further.

The output of the source 10 is applied to a sample and hold circuit 12 which periodically samples the instantaneous amplitude of the source 10 and provides a DC output, $V_k$, directly proportional to this amplitude. The sample and hold circuit 12 may be incorporated into the converter as its first stage or may be supplied as an external component. In either event, the first stage of the converter proper comprises a voltage to phase converter 14 which receives an input $V_k$ from the sample and hold 12 and an input $\sin \omega t$ from an oscillator 16 and provides an output $\sin(\omega t + \delta_k)$. Thus, the voltage to phase converter 14 effectively angle modulates one of the outputs of oscillator 16. Converters of this type operating in the hundred megaherz range are known in the art.

The output of the voltage to phase converter is cascaded through successive stages of the converter. In FIG. 1, a first stage 18, two interior stages 20 and 22, and a final stage 24 are illustrated. Since all stages except the last are identical to each other, only the first stage and the last stage will be described in detail. The first stage 18 consists of a transfer unit 26, a balanced modulator 28, and a differential comparator 30. The transfer unit 26 will be described in detail in connection with FIG. 3. For the present, it is sufficient to understand that this unit serves two basic functions: First, it "expands" the relative phase angle of the input by a factor equal to the radix of the digital representation desired. Thus for a binary converter as described herein, the input $\sin(\omega t + \delta_k)$ becomes $\sin(\omega t - 2\delta_k)$; the sign reversal arises from the nature of the phase-doubling portion of the transfer unit, as will be described in more detail in connection with FIG. 3. The phase-expanded output $\sin(\omega t - 2\delta_k)$ is then applied to subsequent transfer stages for further conversion. Second, the unit 20 provides outputs $\sin \delta_k$ and $\cos \delta_k$ which are functions of the relative phase angle of the input. These are the "preliminary decision functions" referred to earlier and are used to determine the magnitude of $\delta_k$.

From the earlier discussions of the relations between the digit $B_n$ and the functions $\sin \delta_n$ and $\cos \delta_n$, it would be expected that these functions would be utilized directly to implement the decision:

$$B_n = \begin{cases} 0, & \sin \delta_n \geq 0 \\ 1, & \sin \delta_n < 0. \end{cases}$$

However, when the functions $\sin \delta_n$ or $\cos \delta_n$ are close to the decision level (which is zero, in this case)

any slight shift in the amplitude of these functions, such as may be caused by noise in the signals themselves or in the comparators, or by other causes, may effectively shift the signal amplitude over the decision threshhold and thus give an erroneous output. If the decision in each stage is independent of the decision in all other stages, this can lead to unacceptably large errors in the conversion.

To prevent this I form a modified decision function which is used to make the actual deicisions on the $B_n$. The modified decision function serves two purposes: First, it converts the relatively slow transitions of the preliminary decision functions sin $\delta_n$ and cos $\delta_n$ through the transition level into very fast transitions through this level (the terms "slow" and "fast" referring to the rate of change of amplitude with angle at the transition point); second, it synchronizes the transition of a given bit with the transition of the next lower order bit in such a fashion that the higher order bit changes from logical 0 to 1 or from 1 to 0 only when the lower order bit changes from 1 to 0. This implements an inherent characteristic of the natural binary code. The last (lowest order) stage triggers the transition for the next higher stage which then "ripples up" through each stage in succession.

The modified decision function is formed by combining the preliminary decision functions sin $\delta_n$ and cos $\delta_n$ of a given stage with the binary output $B_{n+1}$ of the next lower order stage, to form the function $B_{n+1}\cos\delta_n + \sin\delta_n$, which is positive when sin $\delta_n$ is positive, negative when sin $\delta_n$ is negative, has a high slope during its passage through the transition level, and is relatively immune to slight level changes in sin $\delta_n$ due to noise at the transition level. The decision of $B_n$ is then based on the modified decision function, i.e., $$B_n = \begin{cases} 0, & B_{n+1}\cos\delta_n + \sin\delta_n \geq 0 \\ 1, & B_{n+1}\cos\delta_n + \sin\delta_n < 0. \end{cases}$$

Figure 2:
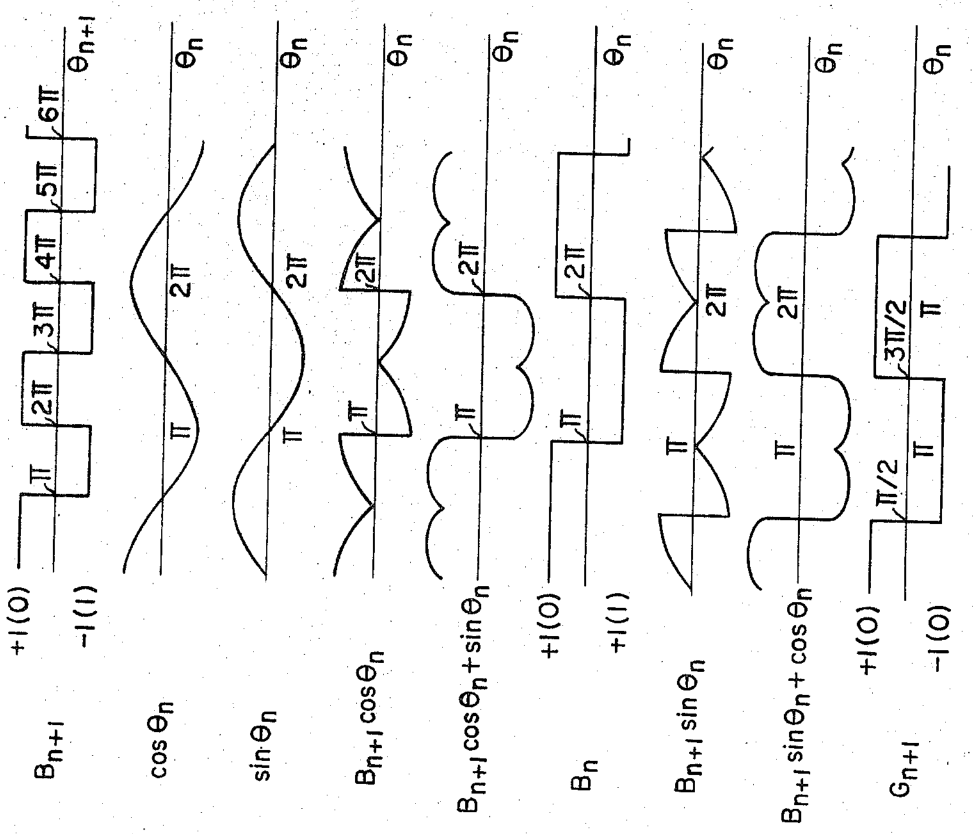
FIG. 2 is a sketch of various waveforms useful in explaining the operation of the invention.

This will be more readily understood on reference to FIG. 2 which shows illustrative waveforms combined to form decision functions in accordance with my invention. The upper waveform which shows the binary digit $B_{n+1}$ of the $(n+2)$th stage is plotted as a function of the relative phase angle $\delta_{n+1}$ of that stage; the other waveforms are plotted as functions of $\delta_n$. The convention used here is that a digital signal is a logical 0 when positive and a logical 1 when negative. It will be noted that the angle $\delta_{n+1}$ repeats twice as quickly as the angle $\delta_n$, and that all angles are modulo $2\pi$. Further, comparing the function sin $\delta_n$ and $B_n$, it will be seen that the latter is a logical 0 when sin $\delta_n$ is positive and is a logical 1 when sin $\delta_n$ is negative, as discussed previously. At the angles at which $B_n$ undergoes a transition, that is, switches from a logical 0 to 1 or from a logical 1 to 0, sin $\delta_n$ is close to zero and thus any noise added to the signal in this condition can cause an improper switching. It will readily be seen, however, that the modified decision function is relatively immune to slight changes in sin $\delta_n$ due to noise at the transition level.

The decision is implemented as follows: Considering stage 18 of FIG. 1 as typical, the function sin $\delta_k$ is applied directly to the positive input of the comparator 30 while the function cos $\delta_k$ is applied to the modulator 28 where it is multiplied by the binary output of the preceeding stage, $B_1$. The negative product, $-B_1\cos\delta_k$, is applied to the invertinginput of the comparator. Since a differential comparator responds to the difference between its inputs the net input is thus $B_1\cos\delta_k + \sin\delta_k$. The output of the comparator 30 is the binary digit $B_0$ and is positive (logical 0) when $B_1\cos\delta_k + \sin\delta_k$ is positive, and negative (logical 1) when the latter is negative as seen in FIG. 2.

Succeeding digits are obtained in the same manner with the exception of $B_N$. The latter is obtained by downconverting the phase expanded signal sin $[\omega t + (-1)^N\delta_N]$. This is accomplished by multiplying this signal by cos $\omega t$ in a modulator 32 and filtering the resultant in a filter 34 to remove the double frequency terms. The filter 34 may also include a stage of amplification to bring its output to a standard level, e.g., unity magnitude. The resultant, sin $\delta_N$, is applied to a Schmidt trigger 36 which provides a positive output as long as the input is above a predetermined reference level and a negative output otherwise; the Schmidt trigger thus implements the decision $$B_N = \begin{cases} 0, & \sin\delta_N \geq 0 \\ 1, & \sin\delta_N < 0. \end{cases}$$

The trigger 36 is provided with a small amount of hysteresis to ensure that, when switched to a given state, it will remain in that state despite small excursions in the input due to noise. Thus, a firm decision is always made in the last stage. As is the case with the outputs of all other stages except the first, the output of the Nth stage, $B_N$, is applied to the immediately preceding stage to form the decision function for generating $B_{N-1}$.

Figure 3:
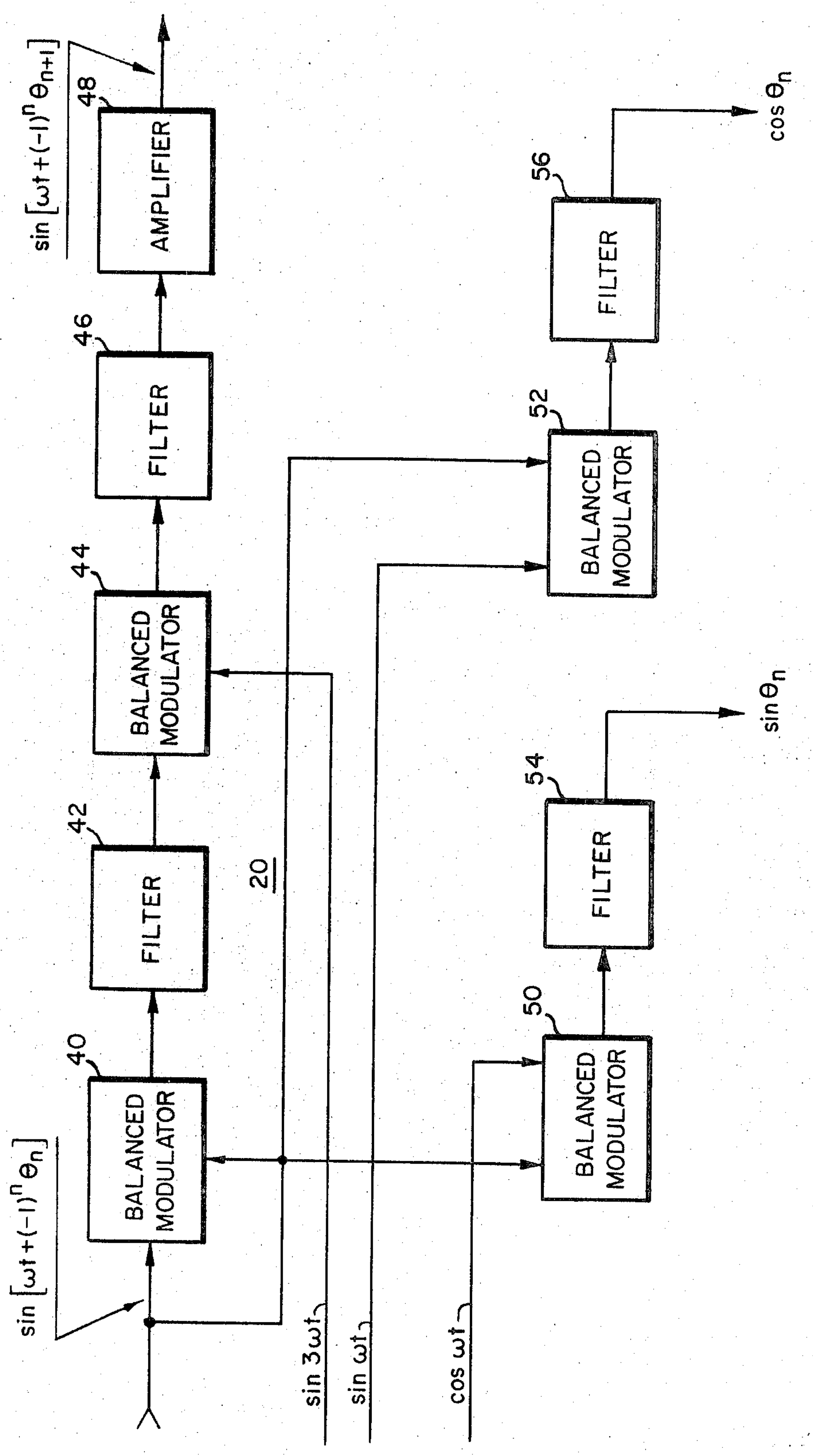
FIG. 3 is a block and line diagram of a preferred form of phase expander utilized in the converter of FIG. 1.

Turning now to FIG. 3, a typical transfer unit is described in detail. For purposes of illustration, this unit may be considered to be $(n+1)^{th}$ stage 20 which generates the binary digit $B_n$. The unit 20 consists of a balanced modulator 40 to which the output sin $[\omega t + (-1)^n\delta_n]$, obtained from the $n^{th}$ transfer stage is applied. The modulator 40 squares this input, that is, multiplies it by itself, and provides an output having a DC term and a double frequency term. The DC term is filtered out by means of a filter 42 which, in this case, comprises a high pass filter which passes only the double frequency term. The latter term is mixed in a balanced modulator 44 with a term sin $3\omega t$ to form a signal of frequency $\omega$ and one of frequency $5\omega$, both signals having a relative phase angle which is twice the phase angle of the relative phase angle of the input. The higher frequency term is filtered out by means of a filter 46, comprising a low pass filter, and the resultant signal brought up to a standard level, e.g., unity magnitude, by means of an amplifier 48. The output is then of the form sin $[\omega t + 2(-1)^n\delta_n] = \pi$ sin $[\omega t + (-1)^{n+1}\delta_{n+1}]$. This output is then applied to the next transfer unit in sequence.

At the same time that the input signal is being phase-expanded, its relative phase angle is being determined by means of a downconversion performed on the input in a pair of balanced modulators 50 and 52 to which the input is applied together with demodulating signals cos $\omega t$ and sin $\omega t$, respectively. The modulator 50 is followed by a low pass filter 54 which removes the double frequency terms generated by the modulator 50 and provides an output of the form sin $\delta_n$. Similarly, the modulator 52 is followed by a low pass filter 56 which provides an output cos $\delta_n$. The filters 54 and 56 may each include amplification stages to bring the filter outputs up to the standard level.

Figure 4:
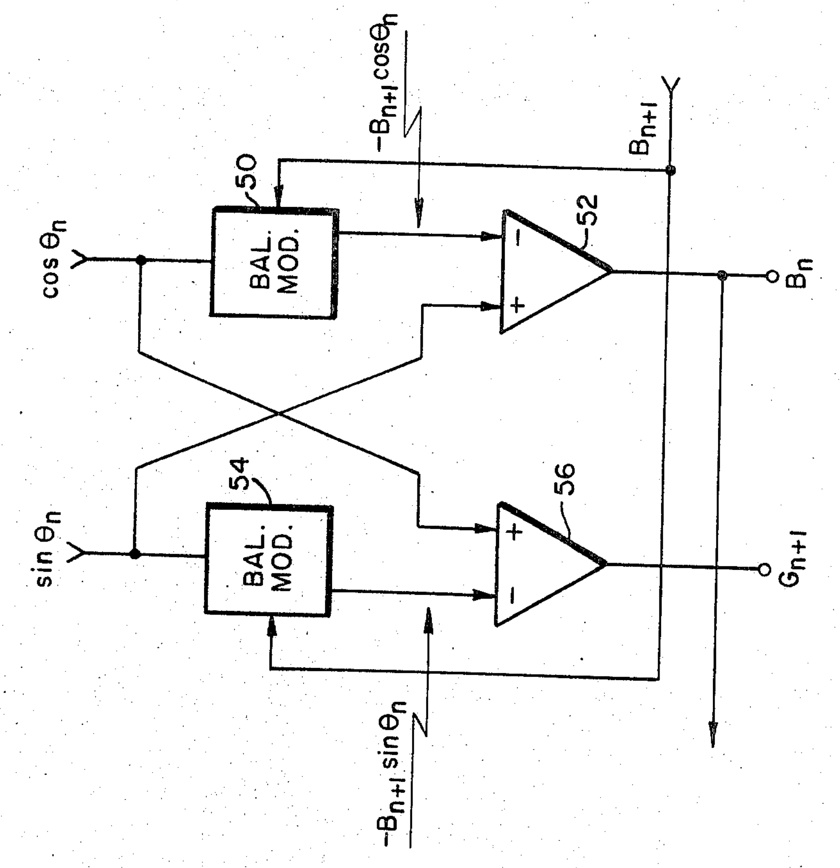
FIG. 4 is a block and line diagram of a modified circuit for obtaining both the natural binary and the Gray code simultaneously.

It will be recalled that the converter of FIG. 1 provides as outputs only the binary digits $B_n$. In many cases it is desirable to have available both the binary and the Gray digits. This is readily accomplished with the addition of a single balanced modulator and a comparator to each converter stage. Referring now to FIG. 4 and considering the $(n+1)^{th}$ converter stage, the preliminary decision function cos $\delta_n$ is applied to a balanced modulator 50 where it is mixed with the binary output $B_{n+1}$ of the preceding stage and thence applied to a comparator 52 with reversed polarity. The preliminary decision function sin $\delta_n$ is applied to the positive input of this comparator in the usual manner and the comparator 52 provides as output the binary digit $B_n$ as described in connection with FIG. 1. Additionally, however, the function sin $\delta_n$ is applied to a further balanced modulator 54 in which it is mixed with the binary output of the next lower order stage $B_{n+1}$ and the negative product $-B_{n+1}\sin\delta_n$ is applied to the negative input of a comparator 56. The function cos $\delta_n$ is cross coupled to the positive input of this comparator. The output of this comparator is a signal that is positive when the net input or modified decision function $B_{n+1}\sin\delta_n + \cos\delta_n$ is positive and is negative when this function is negative. This corresponds to the Gray digit $G_{n+1}$ as shown in FIG. 2. On examining this figure, it will be seen that $G_{n+1}$ obeys the relation $G_{n+1}=B_n \oplus B_{n+1}$ with the symbol $\oplus$ represents the Exclusive OR function.

From the foregoing it will be seen that I have developed an improved analog-to-digital converter. In addition to operating in the phase domain in which it can take advantage of an extremely high frequency carrier to obtain broad-band operation, the converter is characterized by decision-directed feedback which inherently implements basic transition properties of the natural binary sequence and thus eliminates conversion errors which would arise were the conversion in each stage not linked to that of the others via the feedback. Further, the feedback forms a modified decision function which is relatively immune to noise at the transition point and which makes a fast transition through this point so that positive decisions on each of the bits can always be made.

It will be apparent that certain modifications may be made in the invention described herein without departing from either its spirit or its scope. For example, in FIG. 1, the preliminary decision functions may both be applied directly to a comparator in order to obtain the binary digits, thereby eliminating the formation of the modified decision function. However, this leaves the conversion in each stage effectively independent of that in the other stages and thus large errors may occur in the conversion process. Accordingly, bypassing the formation of the auxillary decision function is not recommended. It is, of course, possible to construct an auxillary decision function in other ways than that described herein. For example, recognizing that ambiguities in the binary digit $B_n$ are most likely to occur when the preliminary decision function sin $\delta_n$ is near the transition level, that is, near zero, and that the function cos $\delta_n$ is at a positive or negative maximum at these points, one may effectively suppress any decision based on sin $\delta_n$ when this function is in a small region near the zero point and instead base the decision on cos $\delta_n$. The reverse of this is true for decisions of the $G_n$. However, it will generally be found that such methods require such additional timing, gating and logic circuitry as to make them generally less attractive than the simple scheme set forth herein and thus alternative methods will not be described in detail.

It should also be understood that the decision-directed feedback described herein can advantageously be utilized in converters operating in other than the phase domain. For example, in a binary cascade converter, the magnitude of the signal voltage in each stage is examined and the output of the stage is set to a logical 1 or a logical 0 dependent on whether the voltage lies within a fixed range or not. The signal magnitude is then multiplied and again examined to obtain the next lower order digit. By combining the output of the next lower stage to the adjacent higher order stage, one can obtain a decision function for the higher order stage which will suppress any transition in that stage other than one accompanying a transition from logical 1 to logical 0 in the lower order stage and thus ensure against errors in the higher order stage.

Various other changes may be made without departing from the spirit or scope of the invention and it is intended that the matter set forth herein be taken as illustrative and not in a limiting sense, the scope of the invention being more precisely defined in the claims.

Having described my invention, I claim:

1. A voltage to digital converter comprising:

A. means for modulating the relative phase angle of a carrier by an amount representative of the amplitude of the voltage to be digitized;

B. means for repeatedly multiplying the modulated phase angle by the radix of the digital system in which said voltage is to be expressed;

C. means for phase-demodulating the successive multiplied relative phase angles of said carrier to obtain, for each angle, at least one decision function indicative of the magnitude of each said angle; and D. means responsive to said decision functions to provide corresponding outputs indicative of the angular range within which the respective phase angles lie, said angular ranges corresponding to digits in said digital system.

2. A voltage to digital converter according to claim 1 in which the means for multiplying the modulated phase angle comprises means for generating harmonics of said phase angle.

3. A voltage to digital converter according to claim 2 which includes means for selecting the harmonic corresponding to the radix of the digital system into which the analog system is to be converted from the other harmonics generated during the phase multiplication and means for translating the selected harmonic downwardly in frequency to the frequency of the reference carrier prior to the next successive phase multiplication.

4. A voltage to digital converter according to claim 3 which includes means for further downconverting each phase multiplied signal, as well as the original angle modulated carrier, to a zero frequency signal to thereby provide a decision function from which each of the digits of the digital representation is obtained.

5. A voltage to digital converter according to claim 4 in which said further downconversion means provides the decision function as a combination of the sine and cosine of the corresponding phase angle.

6. A voltage to digital converter according to claim 5 which includes means to apply to said further downconversion means a digital output from the next lower order digit conversion stage.

7. A voltage to digital converter according to claim 1 comprising a binary converter in which the phase multiplying means multiplies the modulated phase by a factor of two at each multiplication, successive digital outputs being obtained from the successively multiplied phase angles.

8. A voltage to digital converter according to claim 7 in which said phase multiplier comprises a modulator having the signal whose phase is to be multiplied applied as both first and second inputs thereto to thereby multiply said inputs, and which includes a high-pass filter for filtering the product to obtain a double frequency term, and a modulator for modulating the double frequency term by the third harmonic of the reference carrier to obtain an output having twice the relative phase angle of the input and the same frequency as the reference carrier.

9. A voltage to digital converter according to claim 8 in which the means for demodulating the phase multiplied signal comprises a modulator having the phase multiplied signal applied as a first input thereto and having a signal synchronized with the carrier applied as a second input thereto.

10. Apparatus for providing a digital representation of an analog signal, comprising:

A. a sample and hold circuit for sampling an analog signal to be converted and providing an output indicative of the instantaneous magnitude of the sampled signal, B. means for modulating the relative phase angle of a carrier proportional to the amplitude of the output of the sample and hold circuit, C. a plurality of transfer units, equal in number to one less than the number of digits to be used in representing said analog signal, each transfer unit comprising:

1. means for multiplying the relative phase angle of an input applied to the transfer unit by the radix of the digital representation and providing a first output corresponding to the multiplied phase angle,
2. means for measuring the relative phase angle of said input and providing a second output indicating in which of several ranges said phase angle lies, the number of such ranges being equal to the radix of the digital representation, D. means interconnecting said transfer units in series such that the first output of each but one of the transfer units is connected as an input to the next following transfer unit, E. means for combining the second output of each transfer unit with a corresponding output from an adjacent transfer unit to form a decision function, and F. means associated with each transfer unit and responsive to the decision function to provide a digital output corresponding to said decision function.

11. Apparatus according to claim 10 in which the means multiplying the relative phase angle of the input to each transfer unit comprises:

1. means for multiplying the frequency and the phase of said input by said radix,
2. filter means for selecting a desired harmonic of the multiplied input signal, and
3. means for translating the frequency of the multiplied signal to a selected reference frequency for application to the following transfer unit.

12. Apparatus according to claim 11 in which:

A. the digital representation comprises a binary representation and in which

B. the means for multiplying the frequency and phase of the input signal comprises a modulator for multiplying the input signal by itself to form a term of twice the frequency and twice the phase of the input, and C. the means for translating the multiplied signal to a selected reference frequency comprises a further modulator having said multiplied signal applied as one input thereto and having a harmonic of the selected frequency applied as a modulating input thereto.

13. Apparatus according to claim 10 in which the means for measuring the relative phase angle of the transfer unit input includes a modulator having said input applied as one input thereto and a selected reference frequency of the same frequency as the frequency of the transfer unit input applied as a modulating input thereto.

14. Apparatus according to claim 10 in which the digital representation comprises a binary representation and in which the means for combining the outputs of adjacent transfer units includes a modulator for combining a function of the second output of one transfer unit with a function of a second output of the next adjacent transfer unit.

15. Apparatus according to claim 10 in which:

A. the digital representation is a binary representation,

B. each transfer unit contains a plurality of modulators for doubling the phase of the input to the transfer unit and for demodulating said input to provide an indication of the relative phase angle of the input associated with each transfer unit, and C. the inputs applied to each modulator in the transfer unit are harmonically related to each other in frequency.

16. A binary analog to digital converter:

A. having a plurality of conversion stages:

1. for examining the magnitude of an input applied to each stage,
2. each stage providing a first numeric output when said magnitude lies within a predetermined range and a second numeric output when it does not,
3. the output of each stage undergoing a transition from one value to another as the input passes into or out of said range, and B. feedback means synchronizing transitions in the output of a higher order stage with transitions in the output of the adjacent lower order stage.

17. A converter according to claim 16 in which the feedback means comprises means for feeding back from each lower order stage to the adjacent higher order stage a signal indicative of the output of the lower order stage to enable transitions in the higher order stage to occur only on the occurrence of alternate transitions in the lower order stage.

18. A converter according to claim 17 in which:

A. each stage but one provides first and second intermediate outputs, each output being a different function of the input to said stage, and B. the feedback signal is combined with both said intermediate outputs to form a decision function from which the numeric output of each stage is determined.

19. A converter according to claim 17 in which the decision function comprises the sum formed by adding the first intermediate output to the product of the second intermediate output and the feedback signal.

20. A converter according to claim 18 in which the first intermediate output of each stage is a sinusoidal function of the input which is to be examined in that stage, the second output being a cosinusoidal function of said input, and in which the signal fed back to each stage from the adjacent lower order stage comprises the numeric output of the lower order stage.

* * * * *